United States Patent [19]

Takimoto

[11] Patent Number: 5,218,319
[45] Date of Patent: Jun. 8, 1993

[54] DIFFERENTIAL AMPLIFIER AND ACTIVE FILTER USING THE SAME

[75] Inventor: Kyuichi Takimoto, Kasugai, Japan
[73] Assignee: Fujitsu Limited, Kawasaki, Japan
[21] Appl. No.: 886,239
[22] Filed: May 21, 1992
[30] Foreign Application Priority Data
  May 24, 1991 [JP] Japan .................. 3-120046
[51] Int. Cl.⁵ ............................................. H03F 3/45
[52] U.S. Cl. ................................... 330/257; 330/306; 330/294
[58] Field of Search ............... 330/257, 294, 303, 306; 307/520

[56] References Cited

U.S. PATENT DOCUMENTS 5,063,356  11/1991  Voorman ........................... 330/306

OTHER PUBLICATIONS

Fukahori et al., "A High Precision Micropower Operational Amplifier", *IEEE Journal of Solid-State Circuits*, vol. SC-14, No. 6, Dec., 1979, pp. 1048-1058.

*Primary Examiner*—James B. Mullins
*Attorney, Agent, or Firm*—Staas & Halsey

[57] ABSTRACT

A differential amplifier comprises a pair of current mirror circuits, a pair of constant current supplies and a pair of differential amplifier circuits. The first differential amplifier circuit is provided between the first current mirror circuit and the first constant current supply. The second differential amplifier circuit is positioned between the second constant current supply and the second current mirror circuit. The second differential amplifier circuit includes a pair of multicollector pnp transistors each having a first one of its collectors connected to the second current mirror circuit and a second one of its collectors connected to the second power supply. The first differential amplifier circuit performs differential amplification on an externally supplied input signal and an output signal of the second differential amplifier circuit, thereby to produce complementary differential output signals which are supplied as corresponding input signals to the second differential amplifier circuit and which performs differential amplification thereon and produces, as the output signal thereof, the output signal of the differential amplifier. A plurality of the differential amplifiers may be used in an active filter.

5 Claims, 7 Drawing Sheets

DIFFERENTIAL AMPLIFIER AND ACTIVE FILTER USING THE SAME

BACKGROUND OF THE INVENTION

This application claims the priority of Japanese Patent Application No. 3-120046 filed May 24, 1991, which is incorporated herein by reference.

1. Field of the Invention

The present invention relates to a differential amplifier and to an active filter using the same.

2. Description of the Related Art

Recently, semiconductor integrated circuits have been used for processing voice signals. One type of such circuits uses an active filter to improve the quality of voices. Conventional active filters however employ a discrete structure having capacitors and resistors externally coupled thereto, thus increasing the total number of components of the overall system. To overcome this shortcoming, it is necessary to integrate individual elements constituting an active filter on a semiconductor substrate to incorporate such elements in the substrate.

FIG. 2 illustrates a conventional filter of this type. Resistors R1, R2 and R3 are connected in series, the resistor R3 is further connected to a non-inverting input 21 of an operational amplifier 2. A capacitor C1 is provided between a junction "a" between the resistors R1 and R2 and ground (power supply) GND. A capacitor C2 is provided between the non-inverting input 21 of the operational amplifier 2 and the ground GND. The operational amplifier 2 has an inverting input 22 connected to its output 23, so that the negative feedback of an output signal $V_o$ is effected. A capacitor C3 is provided between the output 23 of the operational amplifier 2 and a junction "b" between the resistors R2 and R3. The positive feedback of the output signal $V_o$ is accomplished by means of the capacitor C3 and the resistor R3. The resistors R2 and R3, the capacitors C2 and C3, and the operational amplifier 2 constitute a basic secondary RC filter. Connecting the resistor R1 and capacitor C1 to this secondary RC filter constitutes a tertiary RC filter. This tertiary RC filter passes the low-frequency component of an analog input signal $V_{in}$ as an output signal $V_{out}$. Moreover, values of various elements shown in FIG. 2 are as follows: R1=R2=R3=10KΩ, C1=6,800 pF, C2=1,000 pF and C3=18,000 pF.

The tertiary RC filter as shown in FIG. 2 has a discrete structure in which the resistors R1 to R3 and the capacitors C1 to C3 are externally coupled. This structure still has the aforementioned problem such that the number of the required system components is increased, enlarging the system.

Proposed as a solution to the above problem is an active filter in which the individual resistors R1 to R3 are replaced with amplifiers 30 as shown in FIG. 7(a), i.e., a so-called biquad filter. In this biquad filter, the individual amplifiers 30 are integrated together with the last-stage operational amplifier 2 on a semiconductor device in order to reduce the number of components and avoid enlargement of the system.

The amplifier 30 shown in FIG. 7(a) will now be described in detail referring to FIG. 1. The amplifier 30 comprises first and second current mirror circuits 3 and 5, and first and second differential amplifier circuits 4 and 6. The first current mirror circuit 3 comprises a pair of npn transistors Tr3 and Tr4. The transistors Tr3 and Tr4 have their collectors connected to a power supply $V_{cc}$. A voltage $V_1$ is applied in common to the bases of the transistors Tr3 and Tr4.

A first differential amplifier circuit 4 comprises a pair of npn transistors Tr5 and Tr6. The first differential amplifier circuit 4 is connected to the first current mirror circuit 3 and also to ground GND via a first constant current supply I1. The transistors Tr5 and Tr6 have collectors respectively connected at output nodes NO4-1 and NO4-2 to the emitters of the transistors Tr3 and Tr4. The emitters of the transistors Tr5 and Tr6 are connected to each other via resistors RE1 and RE2, respectively, and are connected to the first constant current supply I1.

The analog signal $V_{in}$, or the output signal $V_o$ from an adjoining amplifier 30, is inputted as an input signal $V_{in1}$ to the base of the transistor Tr5. The output signal $V_o$ of the amplifier 30 including the transistor Tr6 is inputted to the base of the transistor Tr6. As a result, the first differential amplifier circuit 4 performs differential amplification on the signals $V_{in1}$ and $V_o$ and outputs a complementary signal.

A second current mirror circuit 5 comprises a pair of npn transistors Tr7 and Tr8. The transistors Tr7 and tr8 have emitters connected to ground GND, and bases connected to the collector of the transistor Tr7, respectively.

A second differential amplifier circuit 6 comprises a pair of pnp transistors Tr9 and Tr10. The collectors of the transistors Tr9 and Tr10 are connected to the collectors of the transistors Tr7 and Tr8 of the second current mirror circuit 5. The emitters of the transistor Tr9 and Tr10 are coupled to each other, and are connected to the power supply $V_{cc}$ via a second constant current supply I2. The base of the pnp transistor Tr9 is connected to the collector of the transistor Tr6. The base of the pnp transistor Tr10 is connected to the collector of the transistor Tr5. The second differential amplifier circuit 6 performs differential amplification on the complementary signal which is outputted from the first differential amplifier circuit 4, and outputs an output signal $V_o$ from the collector of the transistor Tr10.

In the above-structured biquad filter, the amplifier 30 in FIG. 7(a) is equivalent to a circuit shown in FIG. 7(b). This circuit has an operational amplifier 31 of a voltage follower type connected in series to an effective resistor Rx with a large resistance.

Given that various values for physical properties of the biquad filter are expressed as follows, they will have relationships as represented by equations (1) to (8).

| | |
|---|---|
| Current flowing from the output terminal: | $I_o$ |
| Base-emitter voltages of transistors Tr5 and Tr6: | $V_{BE1}$, $V_{BE2}$ |
| Currents flowing across resistors RE1 and RE2: | $I_{R1}$, $I_{R2}$ |
| Thermal voltage: (A voltage based on heat transfer between a base and an emitter of a transistor) | $V_T$ |
| Collector currents of transistors Tr7 and Tr8: | $I_{C1}$, $I_{C2}$ |
| Currents of constant current supplies I1 and I2: | $I_{R0}$, $I_{C0}$ |

It is assumed that all the resistors have the same resistances, i.e., RE1=RE2=RE.

$$Rx = 1/I_o(V_o - V_{in}) \qquad (1)$$
$$= 1/I_o\{-(V_{BE1} + I_{R1} \cdot RE1) + (V_{BE2} + I_{R2} \cdot RE2)\}$$

-continued
$$= RE/I_o(I_{R2} - I_{R1}) + 1/I_o(V_{BE2} - V_{BE1})$$
$$= RE/I_o(I_{R2} - I_{R1}) + V_T/I_o \cdot I_n(I_{R2}/I_{R1})$$
$$\approx RE/I_o(I_{R2} - I_{R1})$$

$$I_o = I_{C1} - I_{C2} \quad (2)$$

$$1/I_{R0}(I_{R2} - I_{R1}) = 1/I_{C0}(I_{C1} - I_{C2}) \quad (3)$$

Rewriting the equation (3) yields equation (4):

$$(I_{R1} - I_{R2})/(I_{C1} - I_{C2}) = I_{R0}/I_{C0} \quad (4)$$

Substituting the equations (2) and (4) into the equation (1) yields equation (5):

$$Rx = RE \cdot I_{R0}/I_{C0} \quad (5)$$

Rearranging the equation (5) yields equation (6):

$$I_{C0} = RE \cdot I_{R0}/Rx \quad (6)$$

The cutoff frequency fO of the active filter is represented by the equation (7):

$$f_0 = 1/(2\pi \cdot C1 \cdot Rx) \quad (7)$$

Rewriting equation (7) yields the equation (8):

$$Rx = 1/(2\pi \cdot C1 \cdot f_0) \quad (8)$$

Setting the ratio of the capacitors C1 to C2 to C3 shown in FIG. 7 to, for example, $$C1:C2:C3 = 1:1/\sqrt{2}:\sqrt{2}$$

and setting C1=50 pF yields C2≈35 pF and C3≈70 pF. Given that the cutoff frequency $f_0$ is 3 KHz, $I_{R0}$ is 50 μA, and RE=10 KΩ, Rx=1.06 MΩ from the equation (8), and $I_{C0}$≈472 nA from the equation (6).

The use of the conventional circuit for processing high frequency signals may be acceptable. However, the use of the conventional circuit with voice frequency bands having a cutoff frequency $f_0$=3 KHz, will give rise to the following significant concerns.

Generally, forming a capacitor having a capacitance of, for example, 1 pF on a semiconductor substrate requires an area of 100 μ☐. If one tries to integrate the capacitors C1, C2 and C3 respectively having the aforementioned large capacitances of 50 pF, 35 pF and 70 pF on the semiconductor substrate, a large area will be required, lowering the integration density.

To avoid such a reduction in integration density, each of the capacitors C1 to C3 may be designed to have a tenth of the mentioned value. In this case, however, it is apparent from the equation (8) that the value of the effective resistance Rx must be increased by a factor of $f_0$. From the equation (6), the current value $I_{C0}$ of the constant current supply I2 must be reduced to one tenth. Diminishing the minute current $I_{C0}$ (≈472 nA) of the constant current supply I2 to a tenth however requires very high precision and is practically impossible.

SUMMARY OF THE INVENTION

It is therefore an object of the present invention to provide a differential amplifier suitable for use in a highly integrated active filter that includes integrated capacitors, and to provide an active filter using this differential amplifier.

To achieve the above object, a differential amplifier embodying the present invention includes a pair of current mirror circuits, a pair of constant current supplies and a pair of differential amplifier circuits. The first current mirror circuit is connected to a first power supply while the second current mirror circuit is connected to a second power supply. At the same time, the first constant current supply is connected to the second power supply and the second constant current supply is connected to the first power supply. The first differential amplifier circuit is provided between the first current mirror circuit and the first constant current supply. The second differential amplifier circuit is positioned between the second constant current supply and the second current mirror circuit. The second differential amplifier circuit includes a pair of multicollector pnp transistors each having a first one of its collectors connected to the second current mirror circuit and a second one of its collectors connected to the second power supply. The first differential amplifier circuit performs differential amplification on an externally supplied input signal and an output signal of the second differential amplifier circuit to produce complementary differential signals. In turn, the complementary signals are received by the second differential amplifier circuit, which performs differential amplification on the complementary signals. The output signal of the second differential amplifier is a product of such differential amplification. In a preferred embodiment, a plurality of the differential amplifiers are connected in series in an active filter.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENT

Figure 3A:
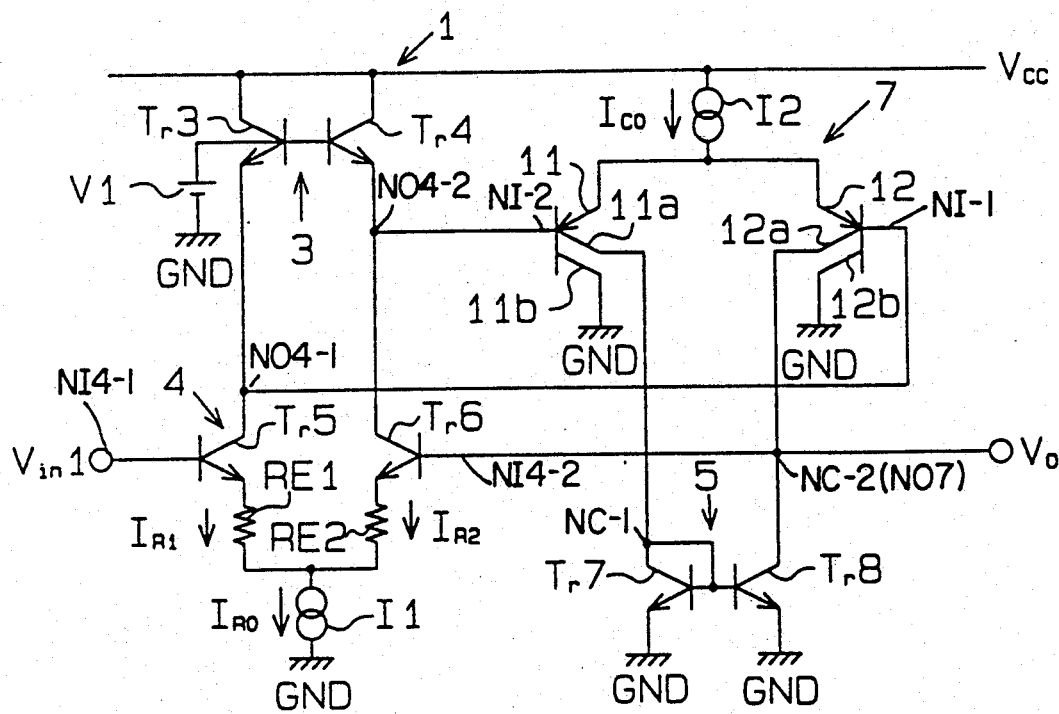
FIG. 3(a) is a circuit diagram of a differential amplifier embodying the present invention.
Figure 3B:
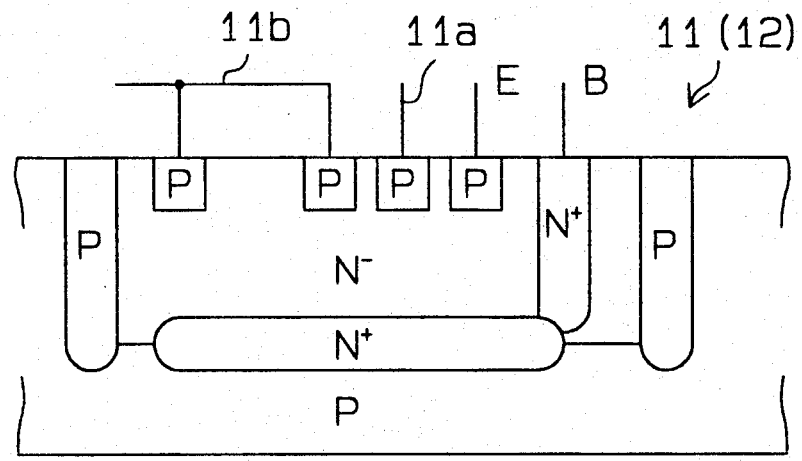
FIG. 3(b) is a schematic sectional view of a multicollector pnp transistor.

The principles of the present invention will now be described referring to FIGS. 3(a), 3(b) and 4 before explaining the preferred embodiment. As shown in FIG. 3(a), a differential amplifier comprises first and second constant current supplies I1 and I2, first and second current mirror circuits 3 and 5, and first and second differential amplifier circuits 4 and 7.

The first current mirror circuit 3, which is connected to a first power supply $V_{cc}$, constitutes a bias circuit. The first constant current supply I1 is connected to a second power supply GND. The first differential amplifier circuit 4 is provided between the first current mirror circuit 3 and the first constant current supply I1. The first differential amplifier circuit 4 has input nodes NI4-1 and NI4-2 at which signals are supplied on which it performs differential amplification, namely an input signal $V_{in1}$, which is externally supplied to the input terminal and thus to node NI4-1, and an output signal $V_0$ of the second differential amplifier circuit 7 supplied to node NI4-2, thereby to produce complementary output signals at the respective output nodes NO4-1 and NO4-2. The second constant current supply I2 is connected to the first power supply $V_{cc}$, and the second current mirror circuit 5 is connected to the second power supply GND. The second differential amplifier circuit 7 is provided between the second constant current supply I2 and the second current mirror circuit 5. The second differential amplifier circuit 7 receives the complementary output signals at nodes NO4-1 and NO4-2 output by the first differential amplifier circuit 4, and outputs the output signal $V_0$ that is acquired by performing differential amplification on the complementary signals input thereto.

The second differential amplifier circuit 7 comprises a pair of multicollector pnp transistors 11 and 12. As shown in FIGS. 3(a) and 3(b), the multicollector pnp transistors 11 and 12 respectively have collectors 11a and 11b, and 12a and 12b. The main collectors 11a and 12a of the respective transistors 11 and 12 are connected at corresponding connection nodes NC-1 and NC-2 to the collectors of transistors Tr7 and Tr8, respectively, of the second current mirror circuit 5, the connection node NC-2 also defining the output node NO7 of the second differential amplifier 7 and which, in turn, is connected to the output terminal at which the output signal $V_0$ is output from the main collector 12a. The sub collectors 11b and 12b of the respective multicollector pnp transistors 11 and 12 are connected to the second power supply GND.

With the ratio of the area of the main collector 11a or 12a to that of the sub collector 11b or 12b being set to 1 to n (100>n>1, and in the disclosed embodiment, n=9), the total current flowing through each of the main collectors 11a and 12a is the fraction 1/(n+1) of the current $I_{C0}$ supplied from the second constant current supply I2. From the equation (1), therefore, the value of an effective resistance Rx will increase by a factor of (n+1). Accordingly, it is apparent from the equation (6) that the capacitance of a capacitor C1 can be 1/(n+1).

Figure 4:
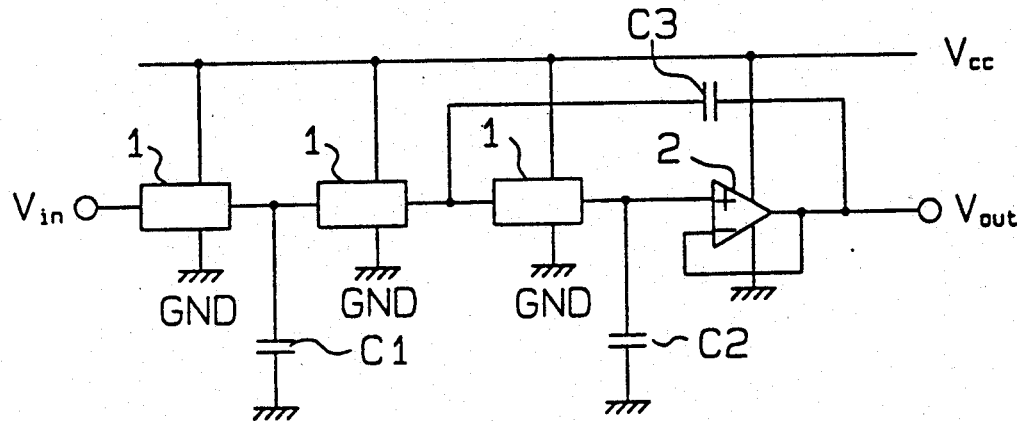
FIG. 4 is a block diagram of an active filter using the differential amplifier of the present invention.

In an active filter shown in FIG. 4, the above-described differential amplifier is used as an amplifier 1 and a plurality of such amplifiers 1 are connected to each other. An operational amplifier 2 for signal output is connected to the last-stage amplifier 1. The capacitor C1 and a capacitor C2 are provided between the output terminals of predetermined amplifiers 1 and the second power supply GND, respectively. The first-stage amplifier 1 receives an analog input signal $V_{in}$. The operational amplifier 2 outputs a predetermined frequency component of the input signal $V_{in}$ as an output signal $V_{out}$.

Figure 8:
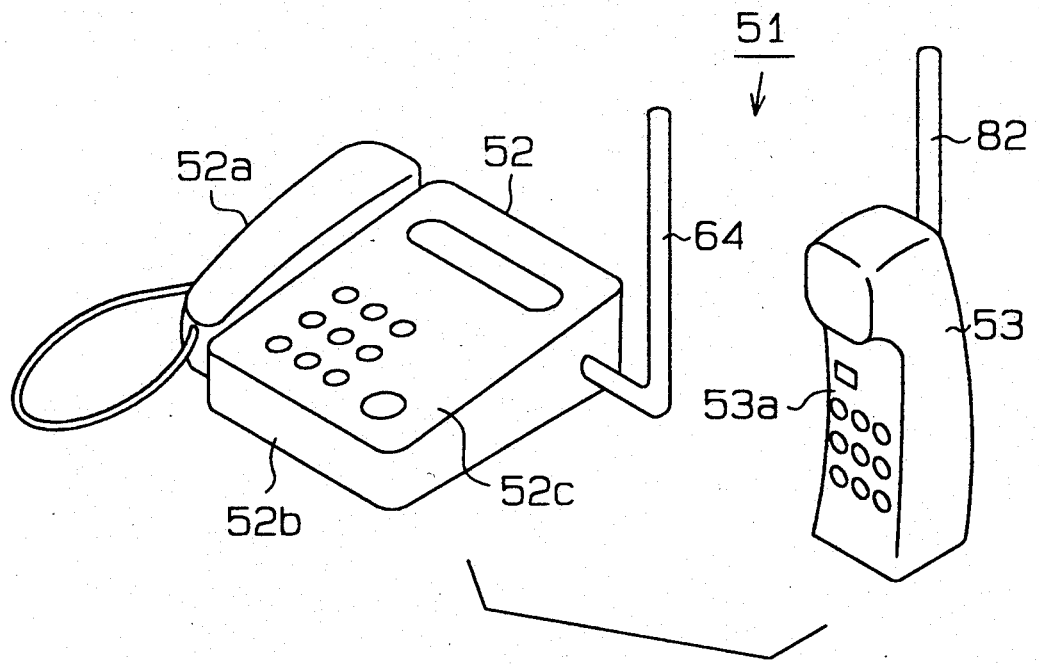
FIG. 8 is a perspective view of a cordless phone system.
Figure 9:
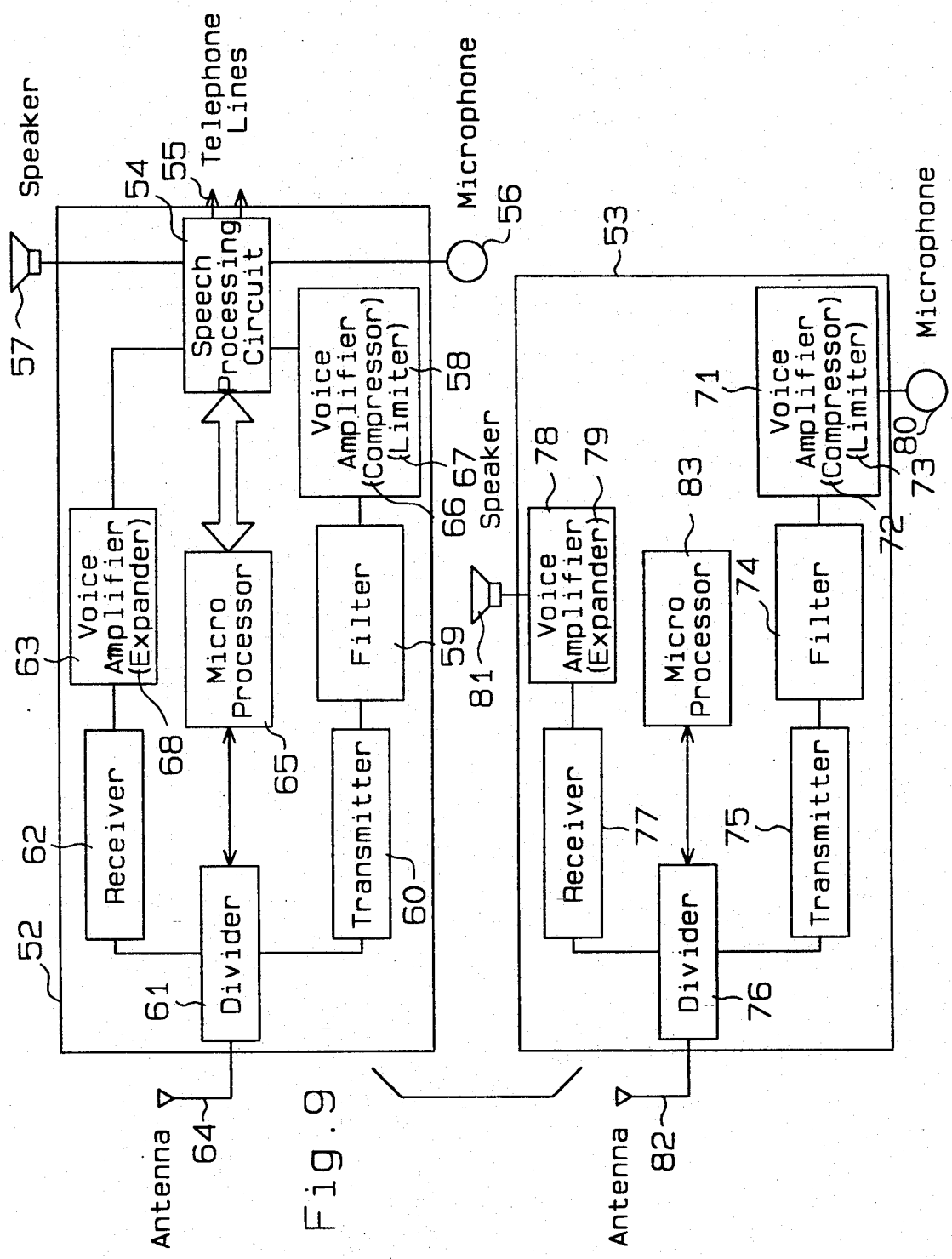
FIG. 9 is a block diagram of the cordless phone system.

Next, a preferred embodiment of the present invention is now described referring to FIGS. 8 and 9. FIG. 8 shows a cordless phone system 51 having a base unit 52 and a remote unit 53. As shown in FIG. 9, the base unit 52 has a speech processing circuit 54 connected to telephone lines 55. A microphone 56 and a speaker 57 are connected to the speech processing circuit 54. The base unit 52 includes a first voice signal amplifier 58, a filter 59, a transmitter 60, a divider 61, a receiver 62, and a second voice signal amplifier 63. These components are connected sequentially to the output side of the speech processing circuit 54.

An antenna 64 is connected to the divider 61. The base unit 52 has a microprocessor 65 to control the speech processing circuit 54 and the like. The microphone 56 and the speaker 57 are accommodated in a receiver frame 52a of the base unit 52. The other components except for the above are accommodated in the base frame 52b of the base unit 52. The antenna 64 is attached to the base frame 52b. The base unit 52 has a key panel 52c on the upper side thereof.

The first voice signal amplifier 58 includes a compressor 66 and a limiter 67. A voice signal is input to the compressor 66 from the speech processing unit 54. The compressor compresses the voice signal and outputs the compressed signal to the limiter 67. If the amplitude of the compressed signal exceeds the threshold level of the limiter 67, the limiter 67 limits the output amplitude of the compressed signal. The filter 59 then filters out the higher harmonics from the compressed voice signal. Such higher harmonics would interfere with other wireless channels and the microprocessor 65. The filter 59 amplifies the voice signal and filters a signal in a predetermined frequency band from the compressed signal. The transmitter 60 and the divider 61 modulate and then transmit the amplified signal together with a carrier signal to the remote unit 53 through the antenna 64.

The divider 61 and the receiver 62 receive incoming signals from the antenna 64, and then demodulate the signal. The second voice amplifier 63 includes an expander 68. The expander 68 expands the received signal and then outputs the signal to the speaker 57 through the speech processing circuit 54.

The remote unit 53 has the same components as the base unit 52, i.e., a third voice signal amplifier 71 including a compressor 72 and a limiter 73, a filter 74, a transmitter 75, a divider 76, a receiver 77, a fourth voice signal amplifier 78 including an expander 79, a microphone 80, a speaker 81, an antenna 82 and a microprocessor 83. These components have the same functions as the components in the base unit 52. The remote unit 53 has a key panel 53a on the outer surface thereof.

Accordingly, when the speech processing circuit 54 receives a voice signal through the telephone lines 55, the microprocessor 65 controls the circuit 54 and the divider 61 upon the operation of the key panel 52c. For example, when a transfer order is input from the panel 53a to the microprocessor 65, the microprocessor 65 controls the circuit 54 and the divider 61 to transfer the voice signal to the remote unit 52. After the voice signal is compressed, limited, filtered and modulated by the components 58, 59 and 60, the voice signal with its carrier signal is transmitted via the divider 61 and the antenna 64.

When the voice signal is received by the antenna 82 of the remote unit 53, the microprocessor 83 controls the divider 76 and the receiver 77 to demodulate the signal. After the demodulated signal is expanded by the fourth voice signal amplifier 78, the expanded signal is transferred to the speaker 79. Therefore, an operator can hear through the speaker 79.

When the voice of the operator is input to the third voice signal amplifier 71 through the microphone 80, the microprocessor 83 controls the third voice signal amplifier 71. Consequently, the voice signal is compressed, filtered, and modulated. Then, the voice signal is transmitted through the antenna 82 to the base unit 52.

Upon receiving the voice signal form the remote unit 53, the microprocessor 65 controls the divider 61. The voice signal is demodulated and expanded by the receiver 62 and the second voice signal amplifier 63. Then, the voice signal is transmitted to the telephone lines 55 through the speech processing circuit 54.

Next, the detailed construction of the filters 59 and 74 will be described referring to FIGS. 5 and 6. For easier explanation, the portions in FIGS. 5 and 6 that have identical or similar structures as those shown in FIGS. 1 to 4 will be denoted by the same reference numerals and characters to avoid a redundant description.

Figure 5:
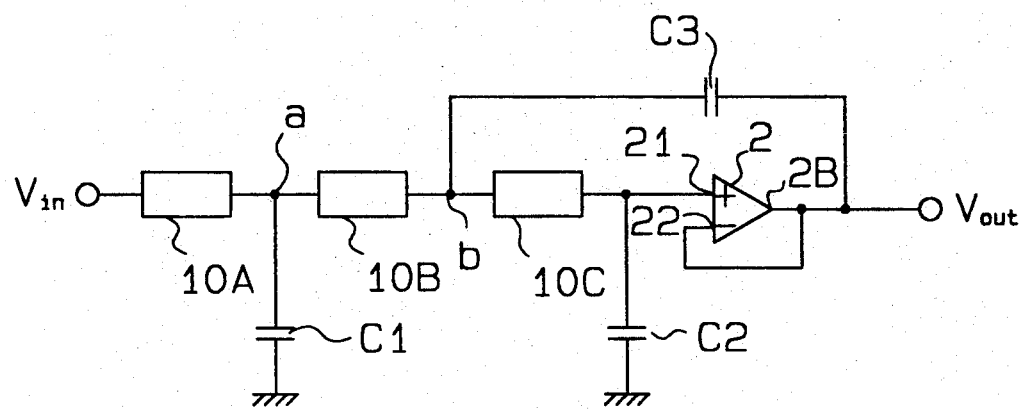
FIG. 5 is a block circuit diagram of an active filter according to one embodiment of the present invention.
Figure 10:
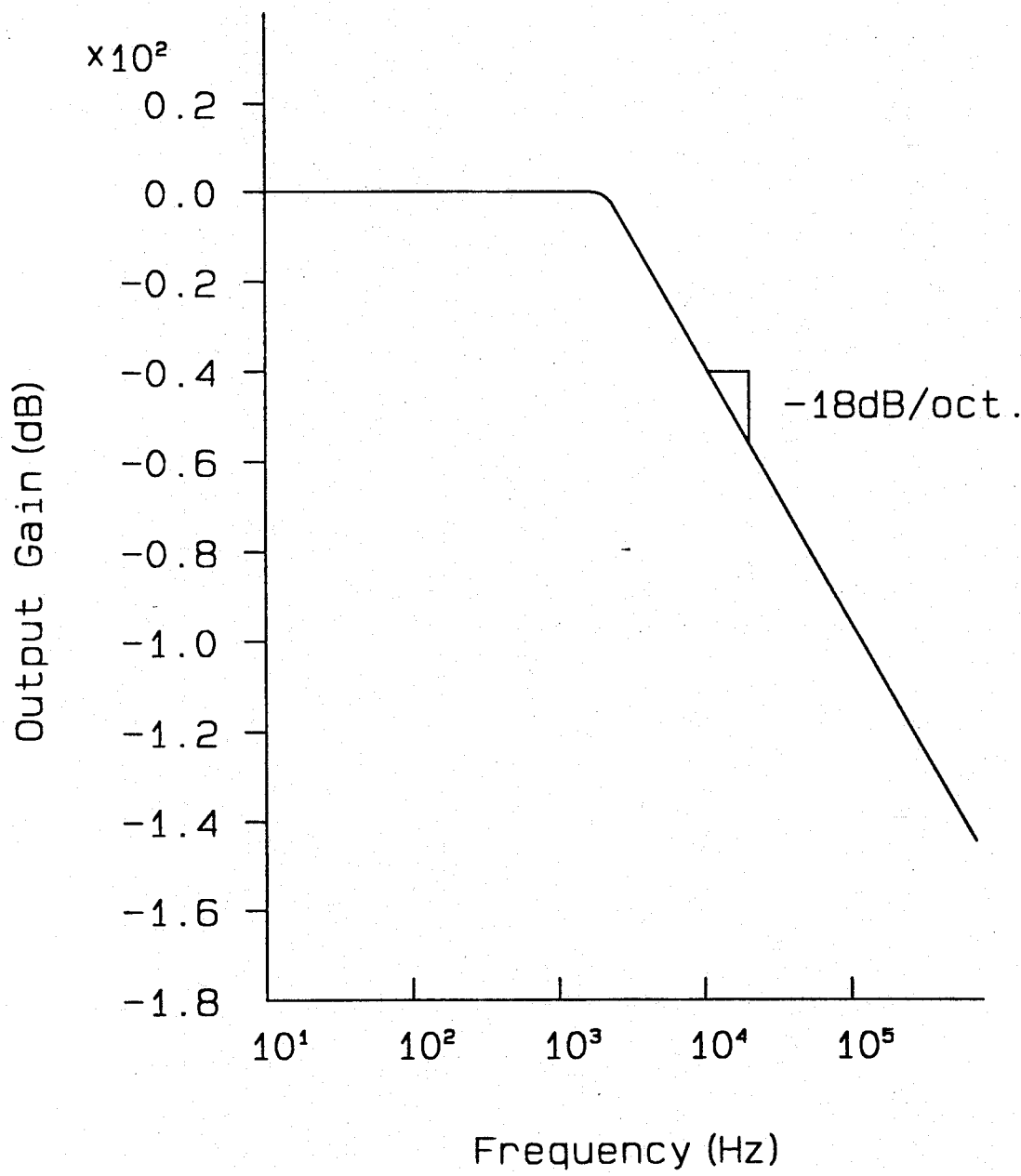
FIG. 10 is a graph showing the output gain vs. frequency characteristic of the cordless phone system.

In the tertiary active filter shown in FIG. 5, three amplifiers 10A to 10C are cascade-connected. The amplifier 10C is connected to a non-inverting input 21 of an operational amplifier 2. A capacitor C1 is connected between a junction "a", between the amplifiers 10A and 10B, and a power supply GND and a capacitor C2 is connected between the non-inverting input 21 of the operational amplifier 2 and the power supply GND. The operational amplifier 2 has an inverting input 22 connected to its output 23, so that negative feedback of its output signal $V_0$ is carried out. A capacitor C3 is provided between the output 23 of the operational amplifier 2 and a junction "b" between the amplifiers 10B and 10C. The positive feedback of the output signal Vo is accomplished by means of the capacitor C3 and the amplifier 10C. This tertiary active filter passes the low-frequency component of an analog input signal $V_{in}$ as an output signal $V_{out}$. FIG. 10 shows the relationship between the output gain (dB) and the frequency (Hz) in the present embodiment.

Figure 6:
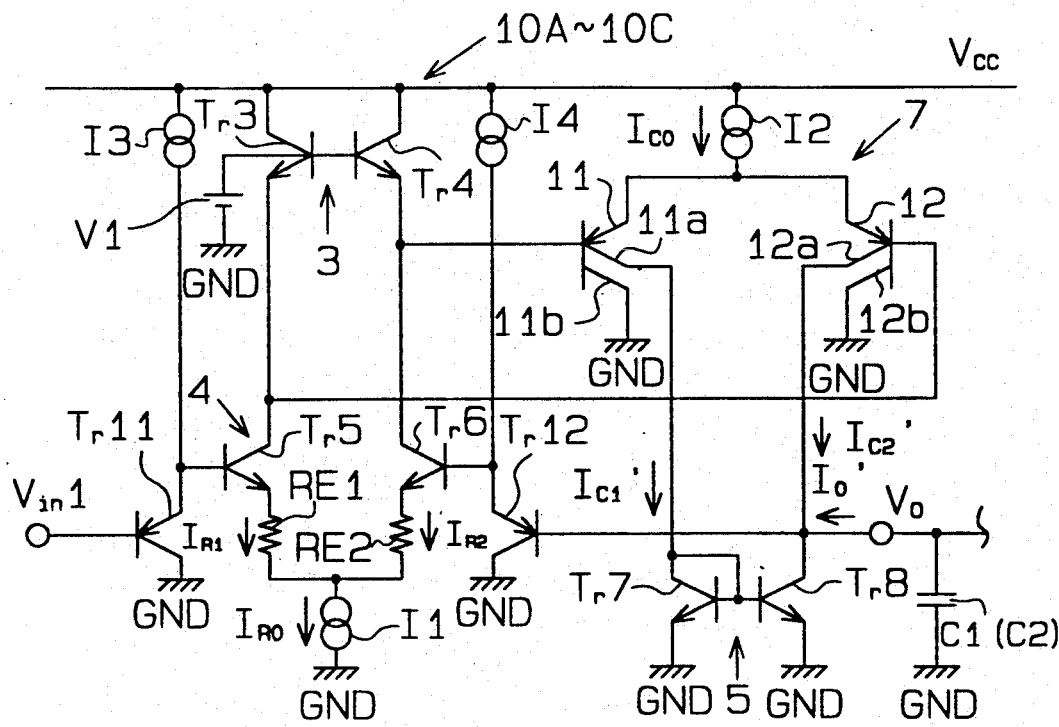
FIG. 6 is a circuit diagram of an amplifier in the active filter according to one embodiment of the present invention.
Figure 7A:
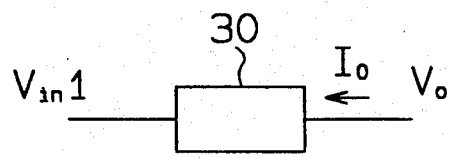
FIG. 7(a) is a block diagram illustrating a conventional amplifier.
Figure 7B:
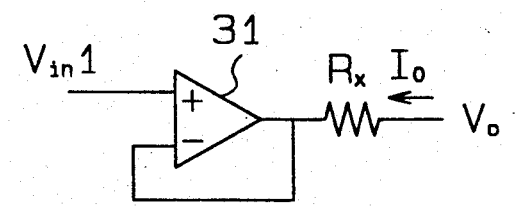
FIG. 7(b) is an equivalent circuit diagram of the amplifier shown in FIG. 7(a)

FIG. 6 presents the detailed illustration of each of the amplifiers 10A to 10C. A pnp transistor Tr11 has its emitter Darlington-connected to the base of a transistor Tr5 in the aforementioned first differential amplifier circuit 4. The base of this transistor Tr11 is supplied with the aforementioned input signal $V_{in1}$. A pnp transistor Tr12 has its emitter Darlington-connected to the base of a transistor Tr6. The base of this transistor Tr12 is supplied with the aforementioned output signal $V_o$.

The pnp transistors Tr11 and Tr12 have emitters connected respectively via the constant current supplies I3 and I4 to the power supply $V_{cc}$. Their collectors are connected to the power supply GND. The pnp transistors Tr11 and Tr12 respectively reduce the base currents of the transistors Tr5 and Tr6 so as not to affect the output current $I_o'$ of the associated amplifier 10A, 10B or 10C.

A second differential amplifier circuit comprises a pair of multicollector pnp transistors 11 and 12. The pnp transistor 11 has a main collector 11a and a sub collector 11b, and the pnp transistor 12 has a main collector 12a and a sub collector 12b. The main collectors 11a and 12a are respectively connected to the collectors of transistors Tr7 and Tr8. The sub collectors 11b and 12b are connected to the power supply GND. The emitters of the multicollector transistors 11 and 12 are connected together at a common junction which is further connected to the aforementioned constant current supply I2.

For the transistors 11 and 12, the ratio of the area of the main collector 11a or 12a to that of the sub collector 11b or 12b on a semiconductor substrate is set to be "1" to "n". The total of currents $I_{C1}'$ and $I_{C2}'$ flowing through the respective collectors 11a and 12a will therefore be the fraction $1/(n+1)$ of the current supplied from the second constant current supply I2.

Figure 1:
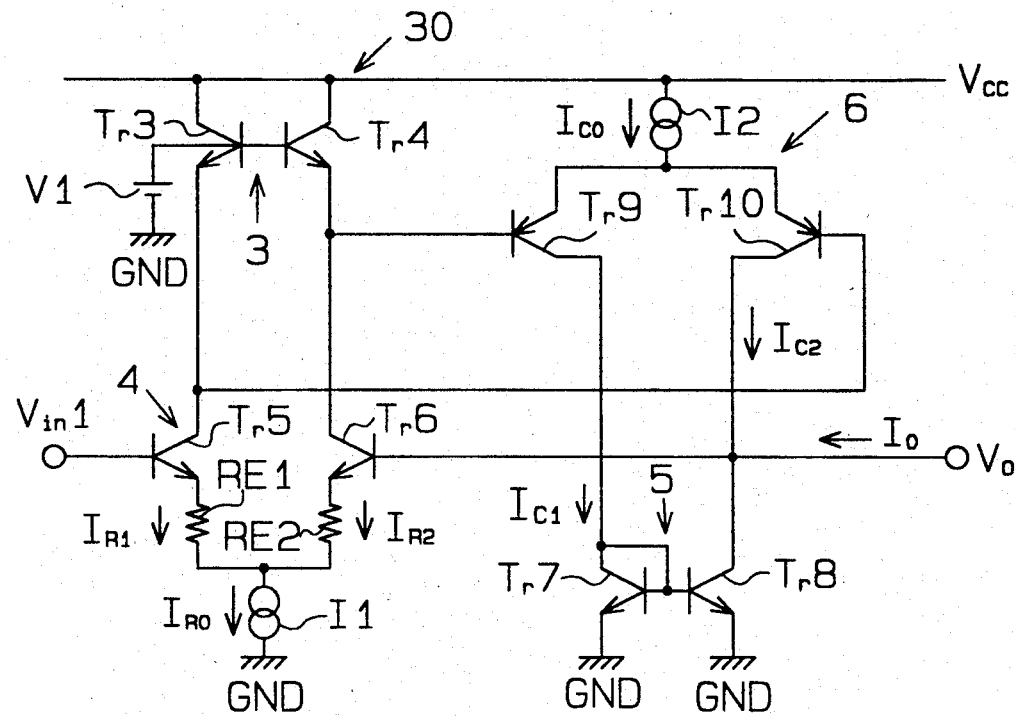
FIG. 1 is a circuit diagram of an amplifier in a conventional active filter.
Figure 2:
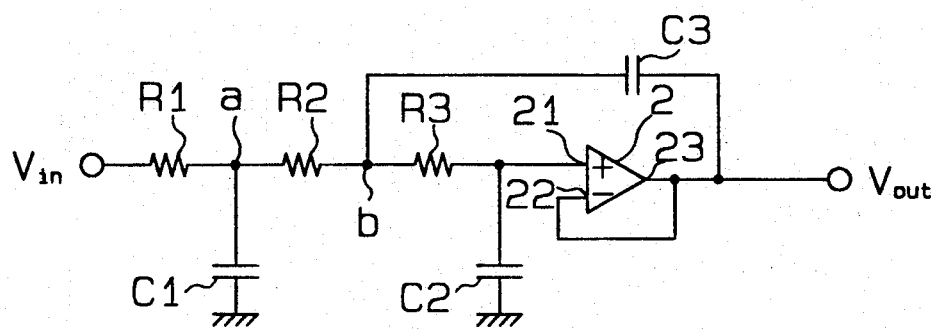
FIG. 2 is a circuit diagram of the conventional active filter.

With the current $I_{C0}$ of the second constant current supply I2 having the same value as that of the prior art shown in FIG. 1, it is apparent from the equation (1) that the values of the effective resistances Rx of the amplifiers 10A to 10C can be set to be the factor $(n+1)$ times greater than the resistance of the prior art. From the equation (7), the capacitances of the capacitors C1, C2 and C3 can be the fraction $1/(n+1)$ of the capacitance in value the prior art.

The areas for the capacitors C1 to C3 can therefore be reduced to $1/(n+1)$. Integrating these capacitors C1 to C3 on the semiconductor substrate permits the entire active filter to be fabricated on a single chip. This design feature can also reduce the number of components of a system using the active filter of the present invention, thereby preventing the system from becoming large.

In this embodiment, if the sum of the currents $I_{C1}'$ and $I_{C2}'$ running through the main collectors 11a and 12a of the multicollector pnp transistors 11 and 12 is set to be equal to the current $I_{C0}$ of the constant current supply I2 in the prior art, the current from the constant current supply I2 can have a value of $I_{C0}.(n+1)$. A bias voltage to control the constant current supply I2 can therefore be generated easily.

What is claimed is:

1. A differential amplifier comprising:
an input terminal and an output terminal;
first and second current mirror circuits, the first current mirror circuit being connected to a first power supply and the second current mirror circuit being connected to a second power supply;
first and second constant current supplies, the first constant current supply being connected to the second power supply and the second constant current supply being connected to the first power supply;
a first differential amplifier circuit connected between the first current mirror circuit and the first constant current supply and having first and second input nodes and first and second output nodes, the first input node being connected to the input terminal; and
a second differential amplifier circuit connected between the second constant current supply and the second current mirror circuit, the second differential amplifier circuit including a pair of multicollector transistors, the respective bases of the pair of multicollector transistors comprising first and second input nodes of the second differential amplifier circuit and being connected, respectively, to the first and second output nodes of the first differential amplifier circuit and each of the pair of multicollector transistors having a first one of its collectors connected to the second current mirror circuit, at a corresponding connection node, and having a second one of its collectors connected to the second power supply, the second differential amplifier circuit having an output node which is defined by one of the connection nodes and which is connected to the output terminal of the differential amplifier;

wherein the first differential amplifier circuit performs differential amplification on an external input signal, supplied from the input terminal to the first input node thereof, and the output signal of the second differential amplifier circuit, produced at the output node of the second differential amplifier circuit and supplied thereby to the second input node of the first differential amplifier circuit, and produces complementary differential output signals at the first and second output nodes thereof; and the second differential amplifier circuit receives, at the first and second input nodes thereof, the complementary differential output signals of the first differential amplifier circuit, performs differential amplification on the received complementary differential signals and produces a corresponding output signal at the output node thereof and correspondingly at the output terminal.

2. A differential amplifier according to claim 1, further comprising:

a semiconductor substrate in which the differential amplifier circuit is formed;

each of the multicollector pnp transistors having a main collector and an associated sub collector, the main collector of each transistor occupying an area of the substrate in the approximate range of one to one hundred times the area of the substrate occupied by the associated sub collector.

3. A differential amplifier according to claim 1, wherein the first differential amplifier circuit further comprises:

first and second current limiting circuits which reduce the current flowing in the first differential amplifier circuit, the input signal being supplied to the first differential amplifier circuit through the second current limiting circuit, and the output signal of the second differential amplifier circuit being supplied to the first differential amplifier circuit through the second current limiting circuit.

4. An active filter comprising:

first, second and third differential amplifiers connected in series, each thereof comprising:

an input terminal and an output terminal, first and second current mirror circuits, the first current mirror circuit being connected to a first power supply and the second current mirror circuit being connected to a second power supply, first and second constant current supplies, the first constant current supply being connected to the second power supply and the second constant current supply being connected to the first power supply, a first differential amplifier circuit connected between the first current mirror circuit and the first constant current supply and having first and second input nodes and first and second output nodes, the first input node being connected to the input terminal, and a second differential amplifier circuit connected between the second constant current supply and the second current mirror circuit, the second differential amplifier circuit including a pair of multicollector transistors, the respective bases of the pair of multicollector transistors comprising first and second input nodes of the second differential amplifier circuit and being connected, respectively, to the first and second output nodes of the first differential amplifier circuit and each of the pair of multicollector transistors having a first one of its collectors connected to the second current mirror circuit, at a corresponding connection node, and having a second one of its collectors connected to the second power supply, the second differential amplifier circuit having an output node which is defined by one of the connection nodes and which is connected to the output terminal of the differential amplifier, wherein the first differential amplifier circuit performs differential amplification on an external input signal, supplied from the input terminal to the first input node thereof, and the output signal of the second differential amplifier circuit, produced at the output node of the second differential amplifier circuit and supplied thereby to the second input node of the first differential amplifier circuit, and produces complementary differential output signals at the first and second output nodes thereof, and the second differential amplifier circuit receives, at the first and second input nodes thereof, the complementary differential output signals of the first differential amplifier circuit, performs differential amplification on the received complementary differential signals and produces a corresponding output signal at the output node thereof and correspondingly at the output terminal, the output terminals of the first and second differential amplifiers being connected to the input terminals of the second and third differential amplifiers, respectively, the input terminal of the first and the output terminal of the third differential amplifiers respectively comprising the input and output terminals of the active filter;

first and second capacitors respectively connected to the corresponding output terminals of the first and the third differential amplifiers; and an operational amplifier having a first input terminal which receives the output signal of the third differential amplifier, the operational amplifier outputting an output signal which includes a predetermined frequency component of the input signal supplied to the input terminal of the filter and correspondingly to the input terminal of the first differential amplifier, and the output signal of the operational amplifier being supplied to the output terminal of the active filter and to the input terminal of the third differential amplifier.

5. A integrated circuit active filter formed on a single chip, the active filter comprising:

a first power supply and a second power supply;

first, second and third differential amplifiers connected in series, each amplifier including:

an input terminal and an output terminal;

first and second current mirror circuits, the first current mirror circuit being connected to a first power supply and the second current mirror circuit being connected to a second power supply;

first and second constant current supplies, the first constant current supply being connected to the second power supply and the second constant current supply being connected to the first power supply;

a first differential amplifier circuit connected between the first current mirror circuit and the first constant current supply and having first and second input nodes and first and second output nodes, the first input node being connected to the input terminal; and a second differential amplifier circuit connected between the second constant current supply and the second current mirror circuit, the second differential amplifier circuit including a pair of multicollector transistors, the respective bases of the pair of multicollector transistors comprising first and second input nodes of the second differential amplifier circuit and being connected, respectively, to the first and second output nodes of the first differential amplifier circuit and each of the pair of multicollector transistors having a first one of its collectors connected to the second current mirror circuit, at a corresponding connection node, and having a second one of its collectors connected to the second power supply, the second differential amplifier circuit having an output node which is defined by one of the connection nodes and which is connected to the output terminal of the differential amplifier;

wherein the first differential amplifier circuit performs differential amplification on an external input signal, supplied at the input terminal to the first input node thereof, and the output signal of the second differential amplifier circuit, produced at the output node of the second differential amplifier circuit and supplied thereby to the second input node of the first differential amplifier circuit, and produces complementary differential output signals at the first and second output nodes thereof; and the second differential amplifier circuit receives, at the first and second input nodes thereof, the complementary differential output signals of the first differential amplifier circuit, performs differential amplification on the received complementary differential signals and produces a corresponding output signal at the output node thereof and correspondingly at the output terminal, first and second capacitors respectively connected to the corresponding output terminals of the first and the third differential amplifiers; and an operational amplifier having a first input terminal which receives the output signal of the third differential amplifier, the operational amplifier outputting an output signal which includes a predetermined frequency component of the input signal supplied to the input terminal of the filter and correspondingly to the input terminal of the first differential amplifier, and the output signal of the operational amplifier being supplied to the output terminal of the active filter and to the input terminal of the third differential amplifier.

* * * * *

UNITED STATES PATENT AND TRADEMARK OFFICE
CERTIFICATE OF CORRECTION

PATENT NO. : 5,218,319
DATED : June 8, 1993
INVENTOR(S) : Kyuichi TAKIMOTO

It is certified that error appears in the above-indentified patent and that said Letters Patent is hereby corrected as shown below:

TITLE PAGE: [73] Assignee: after "Kawasaki" change "," to --; Fujitsu VLSI Limited, Sasugai, both of--.

Col. 8, line 19, change "in value" to --value in--.

Signed and Sealed this

Thirty-first Day of May, 1994

Attest:

BRUCE LEHMAN

*Attesting Officer*     *Commissioner of Patents and Trademarks*